(12) United States Patent
Greeley et al.

(10) Patent No.: US 8,226,772 B2
(45) Date of Patent: Jul. 24, 2012

(54) METHODS OF REMOVING PARTICLES FROM OVER SEMICONDUCTOR SUBSTRATES

(75) Inventors: Neil Joseph Greeley, Boise, ID (US); Dan Millward, Boise, ID (US); Wayne Huang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 462 days.

(21) Appl. No.: 12/350,789

(22) Filed: Jan. 8, 2009

(65) Prior Publication Data

US 2010/0170531 A1   Jul. 8, 2010

(51) Int. Cl.
*B08B 3/04* (2006.01)
(52) U.S. Cl. .................. 134/1.3; 134/1; 134/33; 134/34
(58) Field of Classification Search .................... None
See application file for complete search history.

(56) References Cited

U.S. PATENT DOCUMENTS

| | | | |
|---|---|---|---|
| 5,846,397 A * | 12/1998 | Manzatu et al. | 205/748 |
| 6,029,679 A | 2/2000 | Ota et al. | |
| 6,523,210 B1 | 2/2003 | Andros | |
| 2005/0266359 A1 * | 12/2005 | Ono et al. | 430/398 |
| 2006/0264011 A1 | 11/2006 | Hachigo et al. | |
| 2008/0132151 A1 * | 6/2008 | Iwata et al. | 451/36 |
| 2009/0305511 A1 | 12/2009 | Fucsko et al. | |

FOREIGN PATENT DOCUMENTS

| | | | |
|---|---|---|---|
| JP | 06-097144 | * | 4/1994 |
| JP | 07-094459 | * | 4/1995 |
| KR | 20010004742 | | 1/2001 |

OTHER PUBLICATIONS

Computer translation of JP 06-097144 by Murakami, published Apr. 8, 1994.*
Machine Translation of JP07-094459 by Matsusako, published Apr. 7, 1995.*

* cited by examiner

*Primary Examiner* — Michael Kornakov
*Assistant Examiner* — Ryan Coleman
(74) *Attorney, Agent, or Firm* — Wells St. John P.S.

(57) ABSTRACT

Some embodiments include methods of removing particles from over surfaces of semiconductor substrates. Liquid may be flowed across the surfaces and the particles. While the liquid is flowing, electrophoresis and/or electroosmosis may be utilized to enhance transport of the particles from the surfaces and into the liquid. In some embodiments, temperature, pH and/or ionic strength within the liquid may be altered to assist in the removal of the particles from over the surfaces of the substrates.

12 Claims, 10 Drawing Sheets

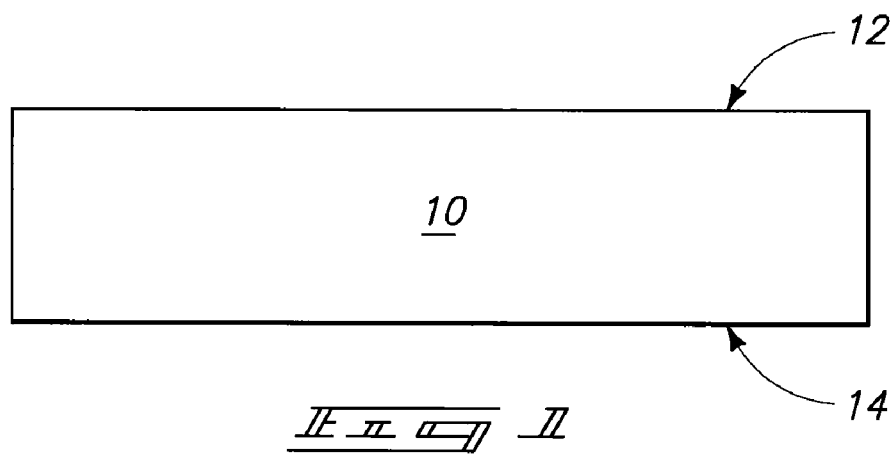
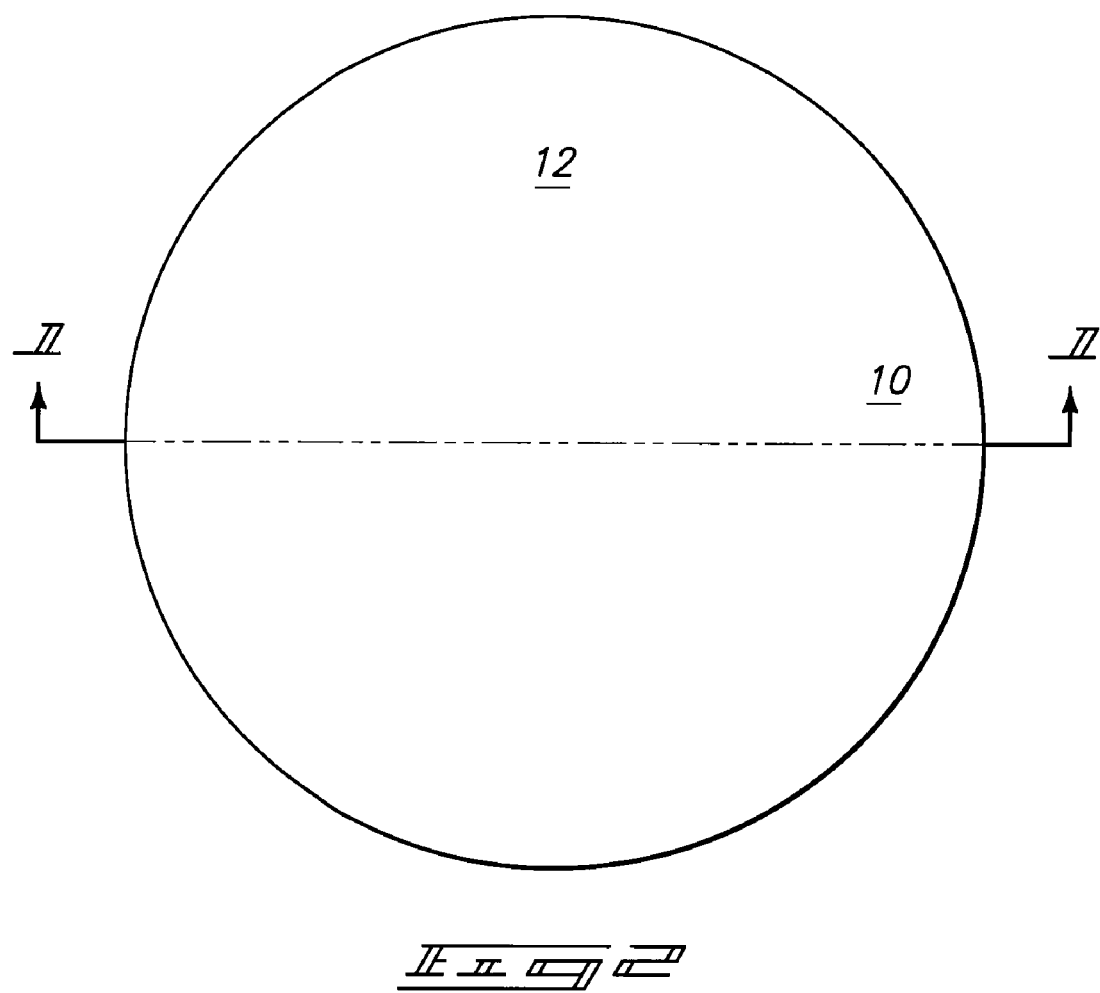

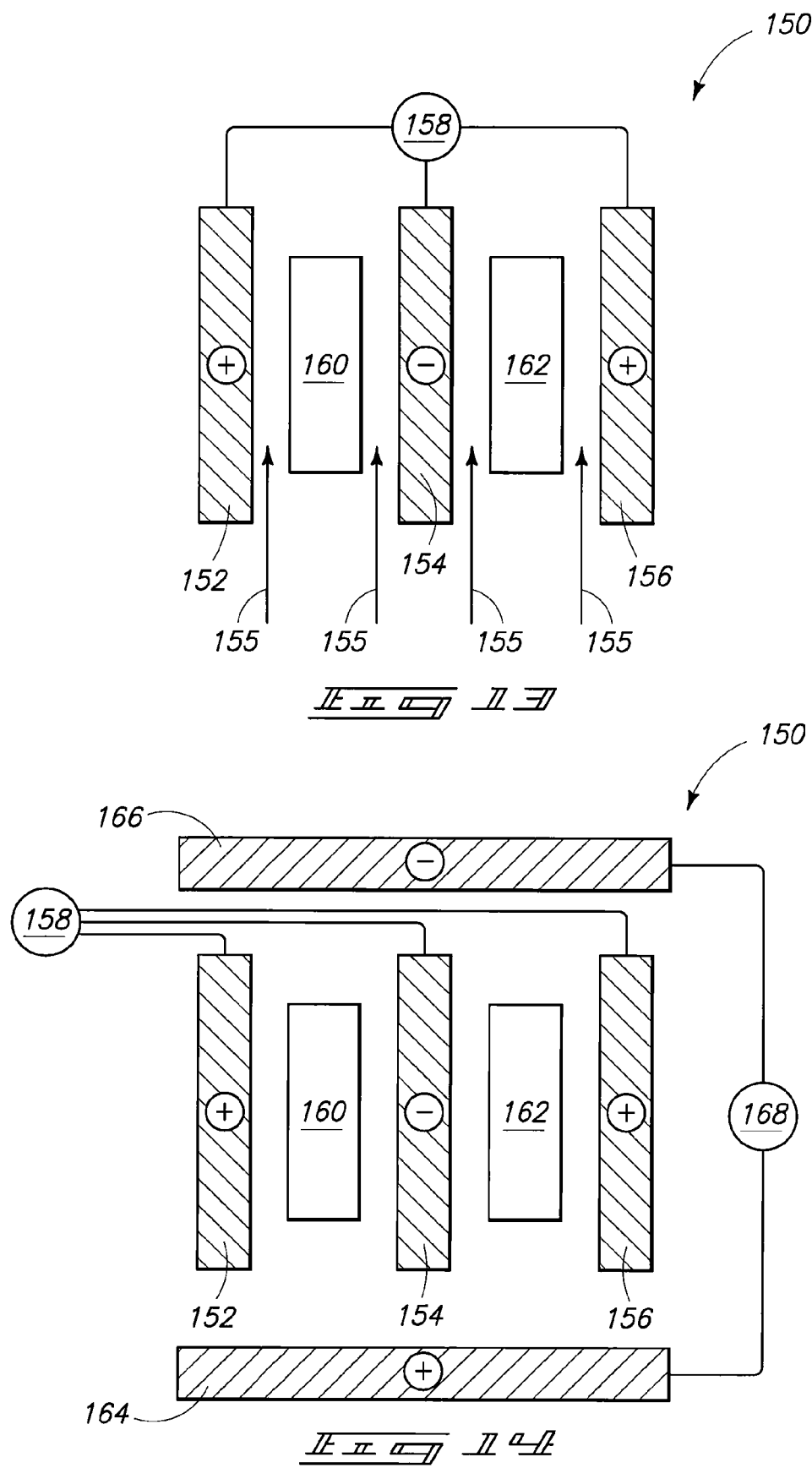

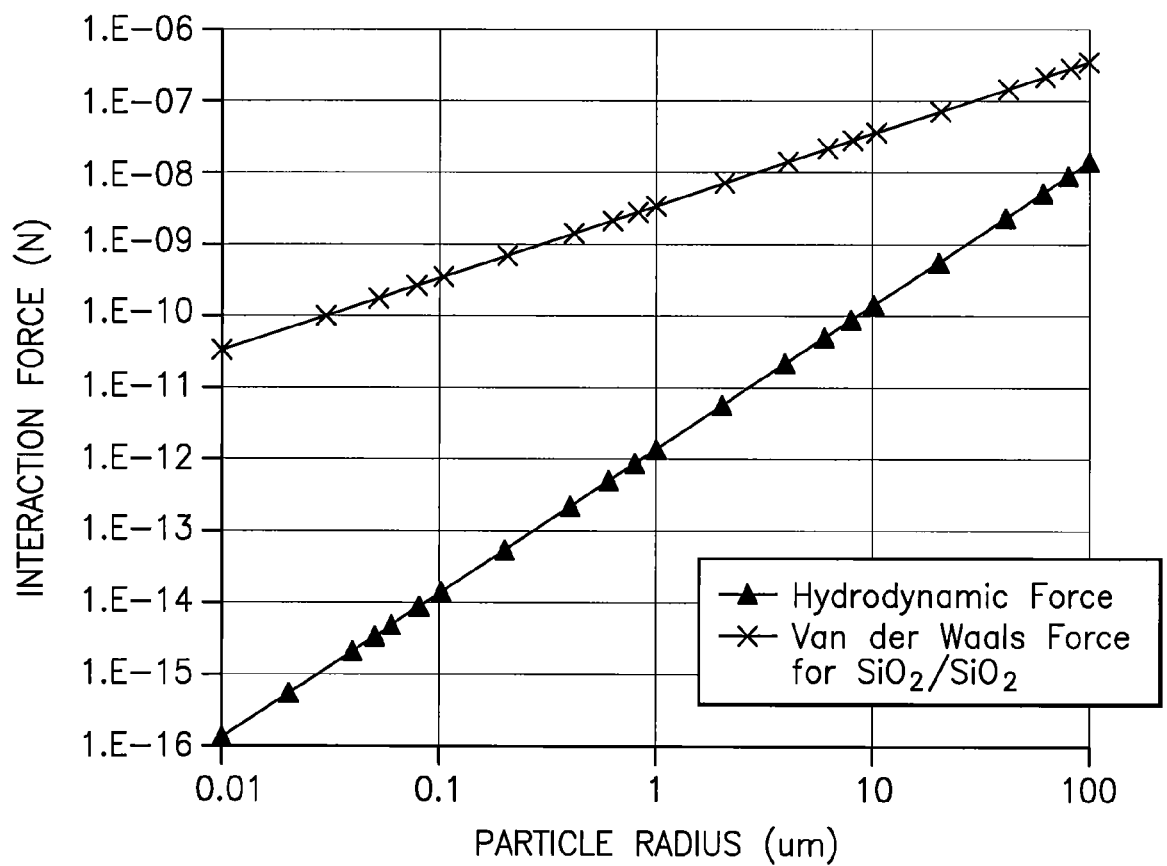

METHODS OF REMOVING PARTICLES FROM OVER SEMICONDUCTOR SUBSTRATES

TECHNICAL FIELD

Methods of removing particles from over semiconductor substrates.

BACKGROUND

Semiconductor fabrication is utilized for construction of, for example, integrated circuitry (IC) and microelectromechanical systems (MEMS). The fabrication comprises formation of numerous devices and structures, and often comprises deposition and removal of materials to pattern structures into desired shapes.

Particles may occur during the deposition and removal of materials, and such particles may interfere with the performance of devices. Accordingly, it is desired to remove the particles. Fabrication processes will often comprise multiple stages dedicated to rinses, megasonic agitation, and/or other conventional methods for particle removal.

Although substantial effort is expended to remove particles, problems associated with the particles persist. Accordingly, it is desired to develop new approaches for removing particles from semiconductor substrates.

BRIEF DESCRIPTION OF THE DRAWINGS

FIGS. 1 and 2 are a diagrammatic cross-sectional side view, and top view, respectively, of a semiconductor substrate that may be utilized in some example embodiments.

FIG. 13 is a diagrammatic, cross-sectional side view of a region of an apparatus being utilized to treat a semiconductor substrate with an electrical field and a flowing liquid to remove particles in accordance with another example embodiment.

FIG. 14 is a diagrammatic, cross-sectional side view of a region of an apparatus being utilized to treat a semiconductor substrate with an electrical field and a flowing liquid to remove particles in accordance with another example embodiment.

FIG. 18 is a graph showing a relationship between interaction forces and particle radii for Van der Waals forces, and showing hydrodynamic forces that may be imparted on particles of varying radii.

DETAILED DESCRIPTION OF THE ILLUSTRATED EMBODIMENTS

Figure 3:
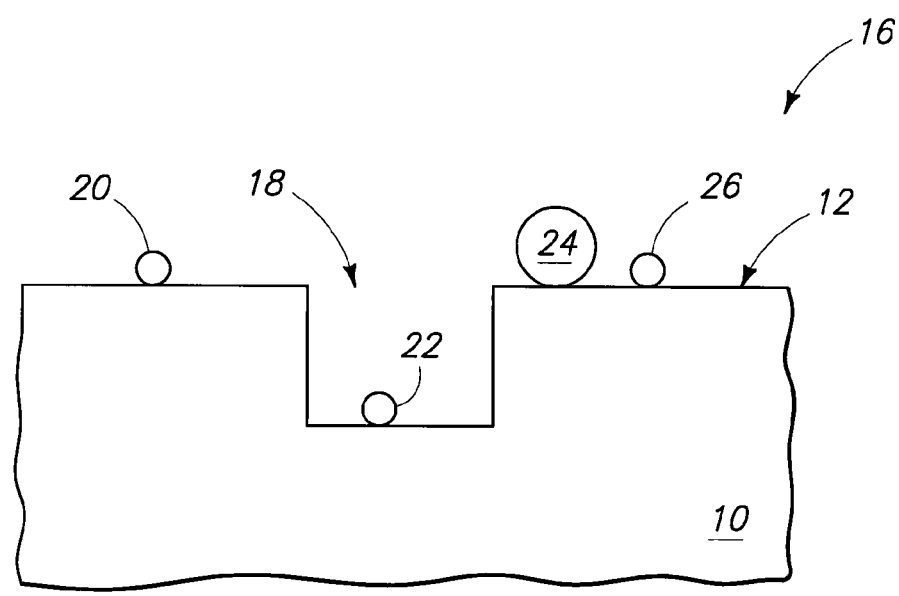
FIG. 3 is a diagrammatic, cross-sectional side view of a semiconductor substrate that may be utilized in some example embodiments.

In some embodiments, new methods for removing particles from over semiconductor substrates utilize electrokinetic forces to assist in transferring the particles into a flowing liquid, whereby the particles may be swept away by hydrodynamic flow forces. The electrokinetic forces may utilize one or both of electrophoresis (i.e., movement of charged particles in an electric field) and electroosmosis (i.e., movement of liquid in an electric field). In some embodiments, electrokinetic forces may be utilized to overcome Van der Waals forces, to assist in dislodging particles from a substrate.

The utilization of electrokinetic forces may provide advantages over utilization of hydrodynamic forces alone. For instance, utilization of electrokinetic forces may reduce cleaning times. Further, in conventional methods that utilize hydrodynamic forces there is often an aggressive mechanical aspect of the cleaning. Such aggressive aspect is utilized to enhance dislodgment of particles from a semiconductor substrate surface, and may, for example, comprise exposure of the substrate to high-amplitude megasonic energy for a substantial duration of time. The aggressive mechanical aspect may damage sensitive structures of a semiconductor substrate. The utilization of electrokinetic forces may enable the aggressive mechanical aspect to be omitted, or to be reduced in aggressiveness and/or duration.

Example aspects of the invention are described with reference to FIGS. 1-17.

Referring to FIGS. 1 and 2, such illustrate an example semiconductor substrate 10 in cross-sectional side view (FIG. 1) and top view (FIG. 2), respectively. Substrate 10 may comprise any suitable semiconductor material, or combination of semiconductor materials, and may, for example, comprise, consist essentially of, or consist of, for example, monocrystalline silicon lightly-doped with background p-type dopant. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" means any supporting structure, including, but not limited to, the semiconductive substrates described above.

Semiconductor substrate 10 may comprise various materials, layers and structures (not shown) associated with IC and/or MEMS fabrication.

Semiconductor substrate 10 is shown having a pair of opposing primary surfaces 12 and 14, with the primary surfaces appearing planar in the diagrammatic views of FIGS. 1 and 2. During IC and/or MEMS fabrication, multiple structures may be formed over a semiconductor substrate, and such structures may lead to a non-planar topography across one or both of the primary surfaces. However, the primary surfaces may still be considered to be generally horizontal, and the non-planar topography may be considered a minor local permutation across the generally horizontal primary surfaces. Thus, in some embodiments a semiconductor wafer may be referred to as having a horizontal primary surface, and such reference is not to be interpreted as meaning that the surface has an absolutely planar topography.

FIG. 3 diagrammatically illustrates a semiconductor construction 16, and may be considered to represent a zoomed-in view of a region of substrate 10 at a processing stage utilized in fabrication of IC and/or MEMS. The substrate 10 has a trench 18 extending therein, and the upper surface 12 of substrate 10 extends along an undulating topography that includes the trench.

A plurality of particles 20, 22, 24 and 26 are shown along the upper surface 12, with particle 22 being shown within the trench.

Figure 4:
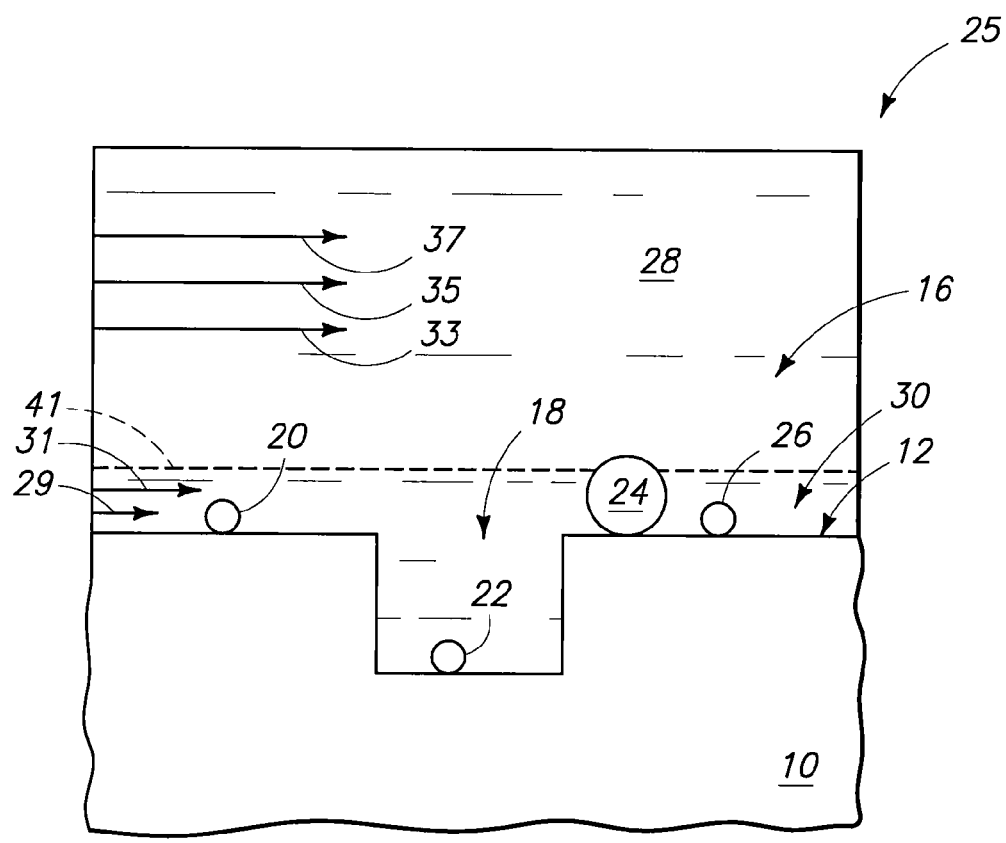
FIG. 4 is a view of the semiconductor substrate of FIG. 3 being exposed to a flowing liquid to remove particles.

Referring to FIG. 4, construction 16 is placed within a system 25. The system 25 is configured to enable a liquid 28 to be flowed across the surface 12 of substrate 10. The liquid 28 is flowed along a direction indicated by arrows 29, 31, 33, 35 and 37. Differences in lengths of the arrows are utilized to indicate differences in the speed of flow. The liquid 28 has a bulk fluid flow above a boundary layer 30. The fluid flow attenuates within the boundary layer 30, and decreases to static or nearly static (in other words, little or no flow) immediately adjacent substrate surface 12. The reduction in the rate of fluid flow in regions adjacent surface 12 relative to other regions of the fluid is due to fluid flow dynamics, and is generally present to some degree when fluid is flowed across a static substrate.

An interface of the boundary layer 30 with the bulk fluid flow region of liquid 28 is diagrammatically illustrated in FIG. 4 with a dashed line 41. The boundary layer has a thickness between surface 12 and interface 41. Such thickness may vary depending on the topography of surface 12, the rate of flow of liquid 28, and the turbulence within the flowing liquid. However, turbulence may lead to damage to structures present on a substrate 10, and thus it may be desired to keep the liquid flow to a speed which does not induce excessive turbulence. The boundary layer thickness may be greater than or equal to about one micron, and may be greater than or equal to several microns for some hydrodynamic flow conditions. In some applications, the thickness of the boundary layer may be reduced to hundreds of nanometers through acoustic streaming technologies.

The trench 18 represents a valley in the undulating topography of surface 12, and such valley is a deep region within boundary layer 30. Unless liquid 28 flows with high velocity, and associated high turbulence, the liquid flow will have little impact on particles trapped within the valleys in the undulating topography.

In operation, the flowing liquid may interact with large particles that extend to a height well above the boundary layer 30 to sweep such particles away from upper surface 12 of substrate 10. In contrast, the flowing liquid has little impact on the particles that are too small to extend above the boundary layer (such as the particles 20 and 26), or that are trapped within valleys in the undulating topography of surface 12 (such as the particle 22 trapped with trench 18). Thus, particle 24 is most effectively removed, relative to the other particles, because it has a diameter larger than the boundary layer. Particles 20 and 26 are more difficult to remove because only a percentage of the bulk flow velocity is available within the boundary layer. Trench particle 22 will be the most difficult to remove.

When IC and MEMS were formed of relatively large-dimension structures, it was only relatively large particles that were of concern and that needed to be removed. As IC and MEMS are formed to increasingly smaller dimensions, smaller particles are becoming of concern. The particles that are presently of concern may have dimensions of less than 50 nanometers, and accordingly may be too small to penetrate above the interface 41 of the boundary layer.

Two problems may occur with particles that are too small to penetrate through the interface 41 of the boundary layer 30. The first may be that the flowing liquid 28 will not dislodge the particles unless the liquid flows with enough force to introduce substantial turbulence in the liquid. The second problem may be that, even if particles are dislodged from the surface, the particles may take a substantial duration of time to pass through the boundary layer and into the bulk flow region of liquid 28. Specifically, the particles dislodged from the surface 12 of substrate 10 may undergo a "random walk" through the boundary layer which can increase the duration of a cleaning cycle. Also, the particles may redeposit onto the substrate instead of passing out of the boundary layer and into the bulk flow region of the liquid.

Some methods which can overcome the first problem are to introduce additional mechanical forces along the boundary between the particles and the surface 12 of substrate 10. Such additional mechanical forces may include momentum transfer from spray and/or from megasonic cavitation. Another method used to attempt to overcome the first problem comprises chemical modification of surface 12 and/or the particles to create forces that assist in repelling the particles from the surface. Even if methods to overcome the first problem are successful, the second problem may still exist. Particles which may be particularly problematic to remove with flowing liquid (either alone or with additional mechanical forces), and which may be problematic for IC and/or MEMS fabrication, are particles having a maximum cross-sectional dimension of less than or equal to 100 nanometers, such as, for example, particles having maximum cross-sectional dimensions of from about 10 nanometers to about 100 nanometers.

Figure 5:
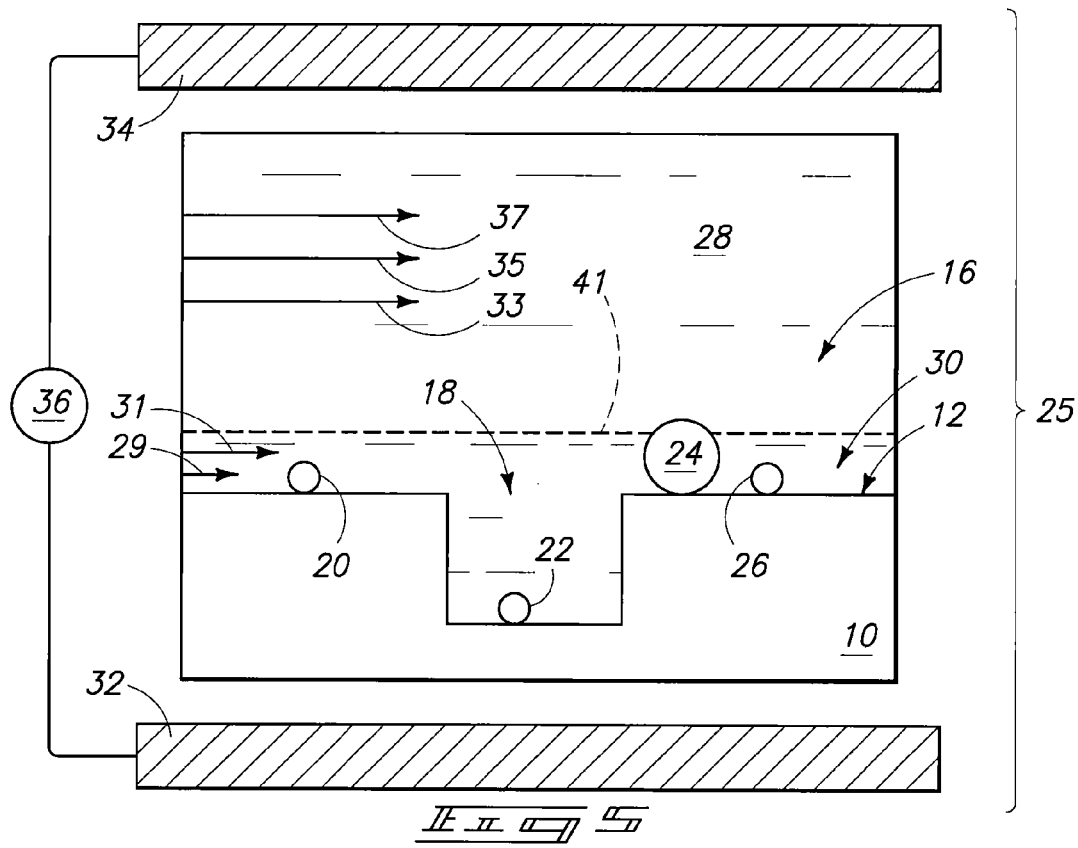
FIGS. 5 and 6 show the semiconductor substrate of FIG. 3 being treated within a system; and specifically being exposed to an electrical field, as well as to flowing liquid, to remove particles in accordance with an example embodiment. The processing stage of FIG. 6 is subsequent to that of FIG. 5.
Figure 6:
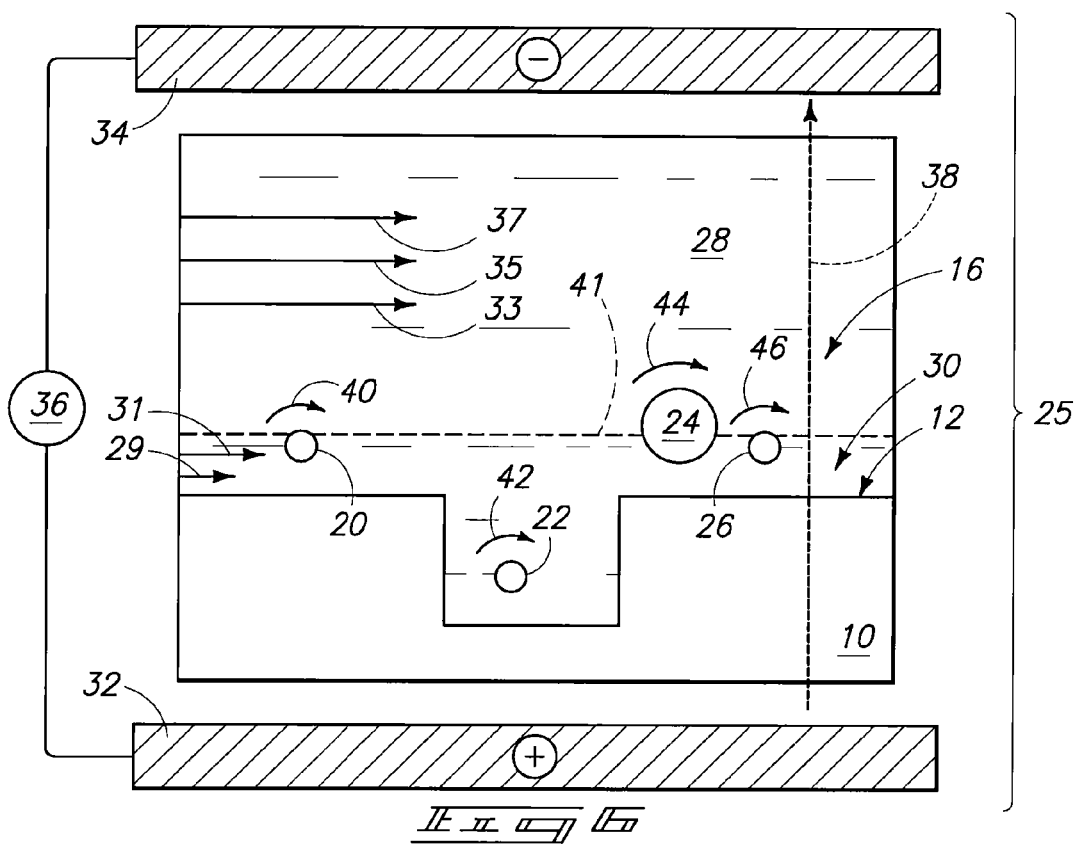

FIGS. 5 and 6 show the system 25 modified in accordance with an example embodiment. The modified system includes a pair of electrodes 32 and 34 on horizontally opposing sides of semiconductor construction 16. The electrodes are connected to one another through a power source 36 which is configured to apply a voltage differential between the electrodes. FIG. 5 shows system 25 prior to a voltage differential being applied to the electrodes, and FIG. 6 shows system 25 after a voltage differential has been applied to the electrodes.

The system 25 at the processing stage of FIG. 6 has an electric field set up between electrodes 32 and 34 due to the voltage differential of the electrodes relative to one another. An arrow 38 is used to indicate a direction of electrophoretic movement of charged particles. The electrical field is perpendicular to a primary horizontal surface of substrate 10, and is of appropriate polarity relative to particles 20, 22, 24 and 26 that it electrophoretically pushes the particles toward electrode 34. The electric field thereby assists in dislodging the particles from the surface 12 of substrate 10. In the shown embodiment, the particles move from a positive electrode to a negative electrode. In other embodiments, the electrodes may be reversed, and the particles may move from the negative electrode toward the positive electrode. In this illustration, the particle is positively charged, and will move toward the negative electrode. In another embodiment, a negatively charged particle could be directed to move toward a positive electrode.

The electrophoretic force on the particles transports the particles through boundary layer 30 and into the bulk flow part of liquid 28, whereupon the particles can be swept away from substrate 10. The movement of particles 20, 22, 24 and 26 is diagrammatically illustrated in FIG. 6 by arrows 40, 42, 44 and 46, respectively.

In some embodiments, liquid 28 may be considered to have a thickness across the surface 12 of the substrate 10, and across the particles 20, 22, 24 and 26. A first region of the thickness of the liquid may be considered to be near substrate 10, and to correspond to boundary region 30; while a second region of the thickness of the liquid is more distant from the substrate than the first region, and has more flow than the first region. The electric field is imparted across the surface 12 of the substrate and across the particles 20, 22, 24 and 26, and is utilized to enhance transport of the particles from the first region of the liquid (the boundary region) to the second region liquid (the more rapidly flowing region, or, in other words, the bulk flow region).

The voltage differential applied between plates 32 and 34 may be any suitable differential to dislodge the particles, and may, for example, correspond to a differential anywhere between 0.1 volts and the electrolysis threshold of liquid 28. The actual voltage differential utilized may be tailored for particular sizes of particles having particular surface charges, in a particular liquid (having a particular ionic strength, a particular temperature, and a particular pH), and relative to a substrate 10 having a surface 12 carrying a particular charge. The charges on the surfaces of the particles and/or the charge on the surface 12 of the substrate may be modified by providing additives (such as surfactants) within the liquid 28, as discussed below. Also, one or more of the temperature, ionic strength and pH may be modified during the electrophoresis, as discussed below.

The voltage differential between plates 32 and 34 may be applied with direct current and/or with alternating current. An advantage of utilizing direct current is that such may allow electrophoretic forces to be directed in a desired direction for a duration long enough to transport particles entirely through the boundary layer 30 and into the bulk flow region of liquid 28. In contrast, an advantage of utilizing alternating current is that such may enable a rocking motion of the particles to be achieved, which may assist in dislodging the particles. Further, alternating current may provide a magnetic field in addition to the electric field, and such magnetic field may assist in dislodging some types of particles.

In some embodiments, the advantages of both alternating current and direct current are utilized sequentially. Specifically, an alternating current is first applied to "rock" the particles and initiate the process of dislodging the particles, and then direct current is applied to transport the particles through a boundary layer and into a bulk flow region of a liquid. In such embodiments, an electric field may be considered to be provided for a duration; and the field may be considered to be maintained with alternating current for an initial part of the duration, and to then be maintained with a direct current for a subsequent part of the duration. In some embodiments, AC and DC may be applied simultaneously, with the AC component riding on a fixed DC component.

Figure 7:
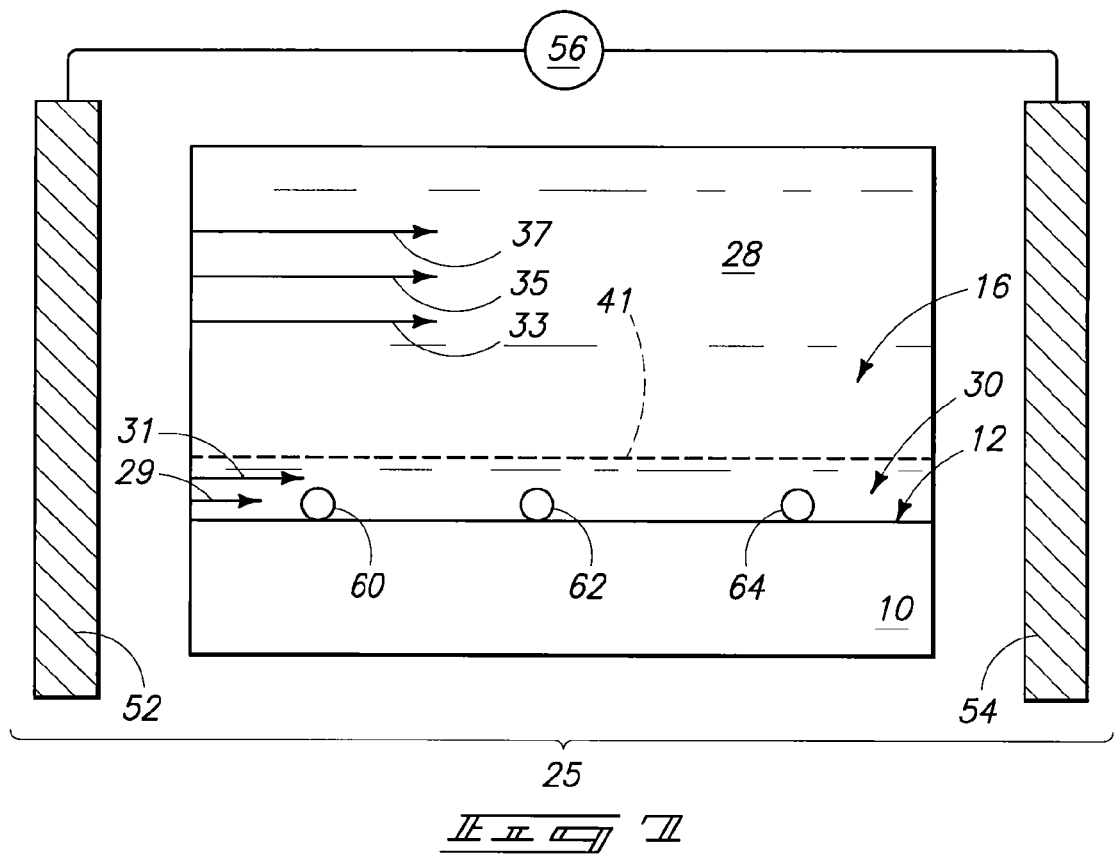
FIGS. 7 and 8 are diagrammatic, cross-sectional side views of a region of a system being utilized to treat a semiconductor substrate with an electrical field and a flowing liquid to remove particles in accordance with another example embodiment. The processing stage of FIG. 8 is subsequent to that of FIG. 7.
Figure 8:
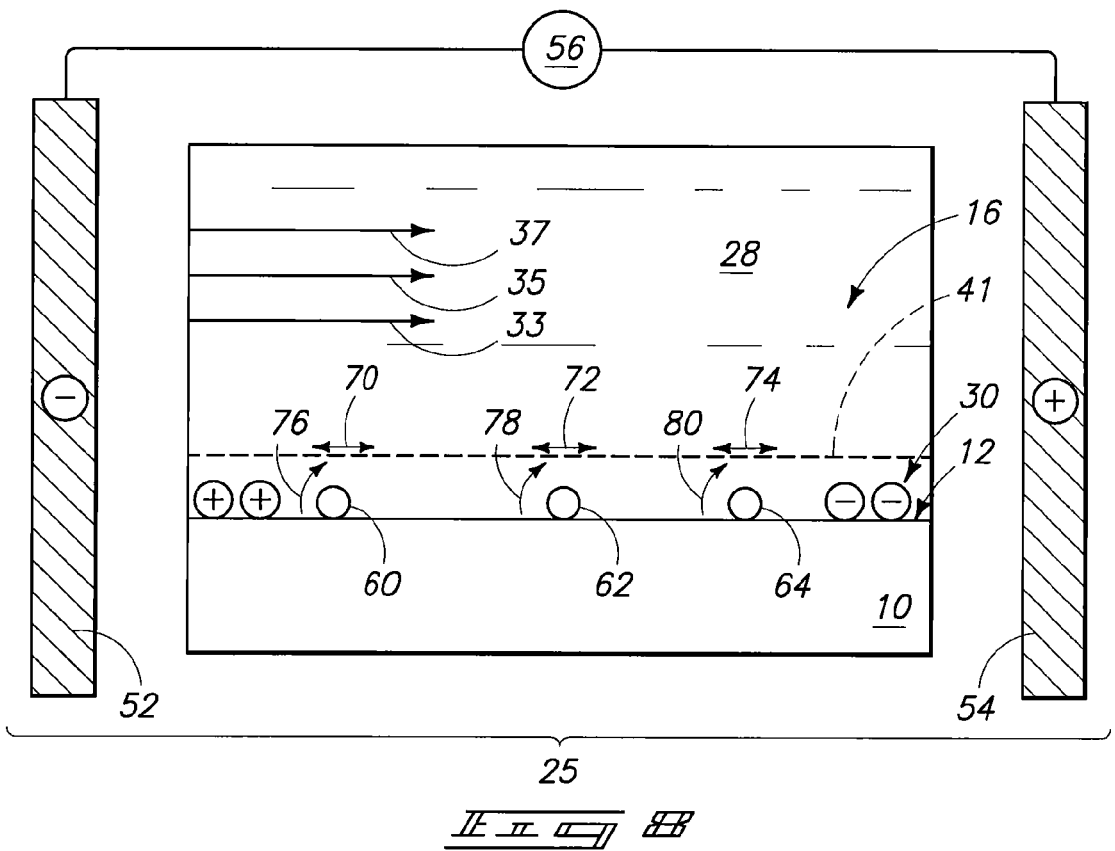

FIGS. 7 and 8 show the system 25 modified in accordance with another example embodiment. A different portion of the semiconductor construction 16 is shown in FIGS. 7 and 8 than was shown in FIGS. 3-6. Specifically, the region of semiconductor construction 16 shown in FIGS. 7 and 8 has a planar portion of surface 12, and has particles 60, 62 and 64 over such planar portion. The arrows 29 and 31 (FIG. 7) are not shown in FIG. 8 due to a lack of room in FIG. 8, but the flow of liquid 28 in the boundary region 30 of FIG. 8 may match that of the liquid in the boundary region of FIG. 7 in some embodiments.

The system of FIGS. 7 and 8 includes a pair of electrodes 52 and 54 on laterally opposing sides of semiconductor construction 16. The electrodes are connected to one another through a power source 56 which is configured to apply a voltage differential between the electrodes. FIG. 7 shows system 25 prior to a voltage differential being applied to the electrodes, and FIG. 8 shows system 25 after a voltage differential has been applied to the electrodes.

The system 25 at the processing stage of FIG. 8 has an electric field set up between electrodes 52 and 54 due to the voltage differential of the electrodes relative to one another. Such electric field is diagrammatically illustrated with a positive charge shown on electrode 54, and a negative charge shown on electrode 52. The electrical field is parallel to a primary horizontal surface of substrate 10. The electric field creates electroosmosis within the static boundary region 30 of the liquid, as illustrated by positive (+) and negative (−) charges accumulating within boundary region 30 adjacent the electrodes 52 and 54, respectively. The location of the charges within the boundary layer are diagrammatically illustrated in the figure. In actual applications, the charges may be part of an electric double layer, with a primary component of the charges being due to ions absorbed on the surface 12 of the substrate.

The electric field causes ions to migrate within the boundary region 30, which induces electroosmosis. Such electroosmosis (water movement) may create forces on the particles 60, 62 and 64, which may assist in dislodging the particles from the surface 12 of substrate 10. The forces may result from, for example, the particles 60, 62 and 64 being drawn/repelled relative to the charged regions. As another example, the migrating ions are surrounded by hydration spheres as they migrate so that there is hydrodynamic flow associated with the migration of the ions, and such hydrodynamic flow may dislodge the particles 60, 62 and 64.

The movement of the particles imparted by the electroosmosis may overcome Van der Waals forces to release the particles from the substrate, whereupon other forces (for instance electrophoretic forces) may transport the particles through boundary layer 30 and into the bulk flow region of liquid 28. In some embodiments, the electroosmosis may rock the particles to assist in dislodging the particles from surface 12, and then other forces may be utilized to transport the particles through the boundary layer and into the bulk flow region of the liquid. Horizontal, or rocking, movement of particles 60, 62 and 64 is diagrammatically illustrated in FIG. 8 by arrows 70, 72 and 74, respectively; and flow of the particles 60, 62 and 64 is diagrammatically illustrated by arrows 76, 78 and 80, respectively.

The voltage differential applied between plates 52 and 54 may be any suitable differential to create electroosmosis, and may, for example, correspond to a differential anywhere between 0.1 volts and the electrolysis threshold of liquid 28. The actual voltage differential utilized may be tailored for particular sizes of particles, having particular surface charges, in a particular liquid (having a particular ionic strength, a particular temperature, and a particular pH), and relative to a substrate 10 having a surface 12 carrying a particular charge. The charges on the surfaces of the particles and/or the charge on the surface 12 of the substrate may be modified by providing additives (such as surfactants) within the liquid 28, as discussed below. Also, one or more of the temperature, ionic strength and pH may be modified during the electroosmosis, as discussed below.

The voltage differential between plates 52 and 54 may be applied with direct current or with alternating current. In some embodiments, both alternating current and direct current may be utilized; with the alternating and direct currents being applied sequentially relative to one another.

The electrophoresis discussed with reference to FIGS. 5 and 6 may be utilized entirely independently of the electroosmosis discussed with reference to FIGS. 7 and 8, so that some embodiments employ only electrophoresis, and other embodiments employ only electroosmosis. Alternatively, the electrophoresis and electroosmosis may be utilized synergistically with one another. For instance, the electroosmosis may be utilized to start the movement of the particles by rocking the particles along a horizontal axis and thereby disrupting Van der Waals and/or other forces retaining the particles to the substrate. Subsequently, electrophoresis may be utilized to lift the particles from the substrate and transport them through a boundary region and into a bulk flow region of a liquid. In embodiments in which both electroosmosis and electrophoresis are utilized, the electroosmosis and electrophoresis may be simultaneous relative to one another, or may be sequential relative to one another.

Any suitable apparatus may be utilized for the electrophoresis and electroosmosis discussed above with reference to FIGS. 5-8. Some example apparatuses are illustrated in FIGS. 9-14.

Figure 9:
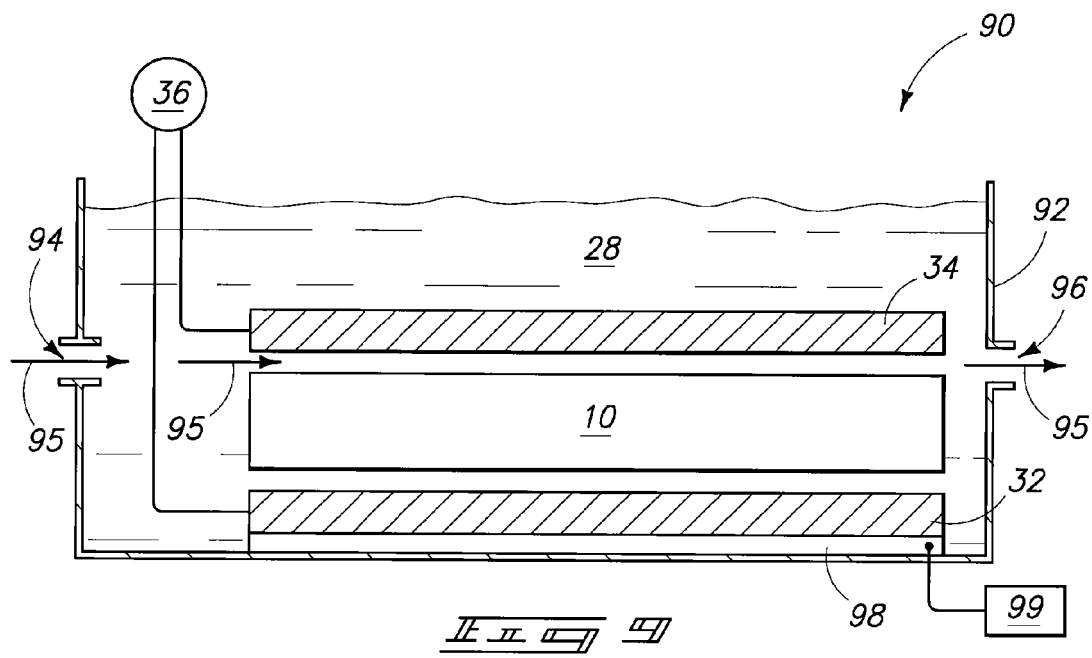
FIG. 9 is a diagrammatic, cross-sectional side view of a region of an apparatus being utilized to treat a semiconductor substrate with an electrical field and a flowing liquid to remove particles in accordance with another example embodiment.

FIG. 9 shows a system 90 configured for utilization of electrophoresis to assist in removal of particles. Similar numbering will be used to describe FIG. 9 as was utilized above in describing FIGS. 1-8, where appropriate.

System 90 includes a bath of liquid 28 retained within a vessel 92. The vessel has an inlet 94 and an outlet 96 so that the liquid 28 may be continuously flowed through the vessel during utilization of the liquid to remove particles. The flow of the liquid is diagrammatically illustrated with arrows 95.

A semiconductor substrate 10 is retained within the vessel between a pair of electrodes 32 and 34. The substrate and electrodes may be retained in the shown orientation with one or more support structures (not shown).

The electrodes 32 and 34 are electrically connected to a power source 36. In operation the power source is utilized to create a voltage differential between the electrodes 32 and 34 in a manner discussed above with reference to FIGS. 5 and 6.

System 90 is illustrated to also comprise a mechanism for imparting sonic energy into the liquid 28. The mechanism is diagrammatically illustrated as comprising a megasonic transducer 98 along the bottom of vessel 92, and a power source 99 coupled to the megasonic transducer. In operation, the power source may cause high-frequency agitation of megasonic transducer 98 which can then impart megasonic energy to liquid 28. The utilization of megasonic energy may enhance removal of particles in some embodiments. In other embodiments, the mechanism for imparting sonic energy may be omitted. In the shown embodiment, the semiconductor substrate 10 is a wafer extending parallel to a megasonic transducer 98; in other embodiments, the wafer may extend perpendicular to the megasonic transducer.

Figure 10:
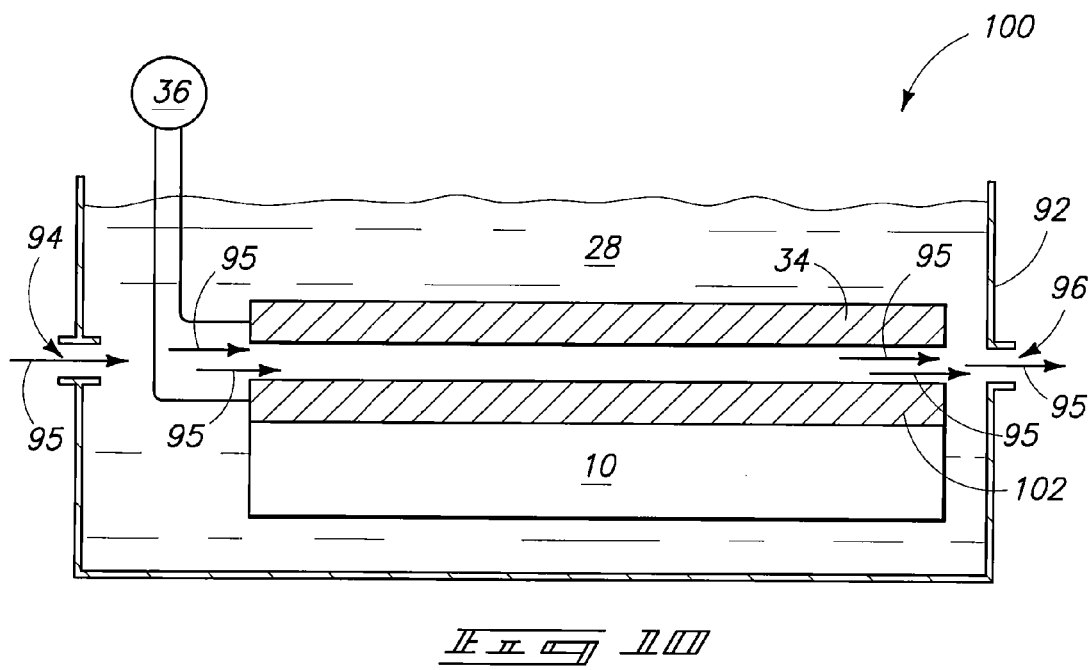
FIG. 10 is a diagrammatic, cross-sectional side view of a region of an apparatus being utilized to treat a semiconductor substrate with an electrical field and a flowing liquid to remove particles in accordance with another example embodiment.

FIG. 10 shows another example system (100) configured for utilization of electrophoresis to assist in removal of particles. Similar numbering will be used to describe FIG. 10 as was utilized above in describing FIGS. 1-9, where appropriate.

The system 100 of FIG. 10, like the system 90 of FIG. 9, comprises the vessel 92 having the inlet 94 and outlet 96. Such vessel may be utilized for achieving flow of liquid 28 across a semiconductor substrate 10. However, system 100 of FIG. 10 differs from the system 90 of FIG. 9 in that the system 100 utilizes a conductive upper material 102 of semiconductor substrate 10 in place of the electrode 32 of system 90. Specifically, the conductive upper material 102 and electrode 34 are connected to one another through a power source 36, and in operation the power source creates an electric field between the upper material 102 and electrode 34.

The system of FIG. 10 may be utilized in applications in which a semiconductor substrate has a conductive upper material, such as, for example, applications in which a conductive upper material is formed during fabrication of IC devices. The conductive upper material may comprise, for example, one or more of various metals (for instance, platinum, tungsten, titanium, tantalum, etc.), metal-containing compositions (for instance, metal nitrides, metal silicides, etc.), and conductively-doped semiconductor materials (for instance, conductively-doped silicon, conductively-doped germanium, etc.).

Figure 11:
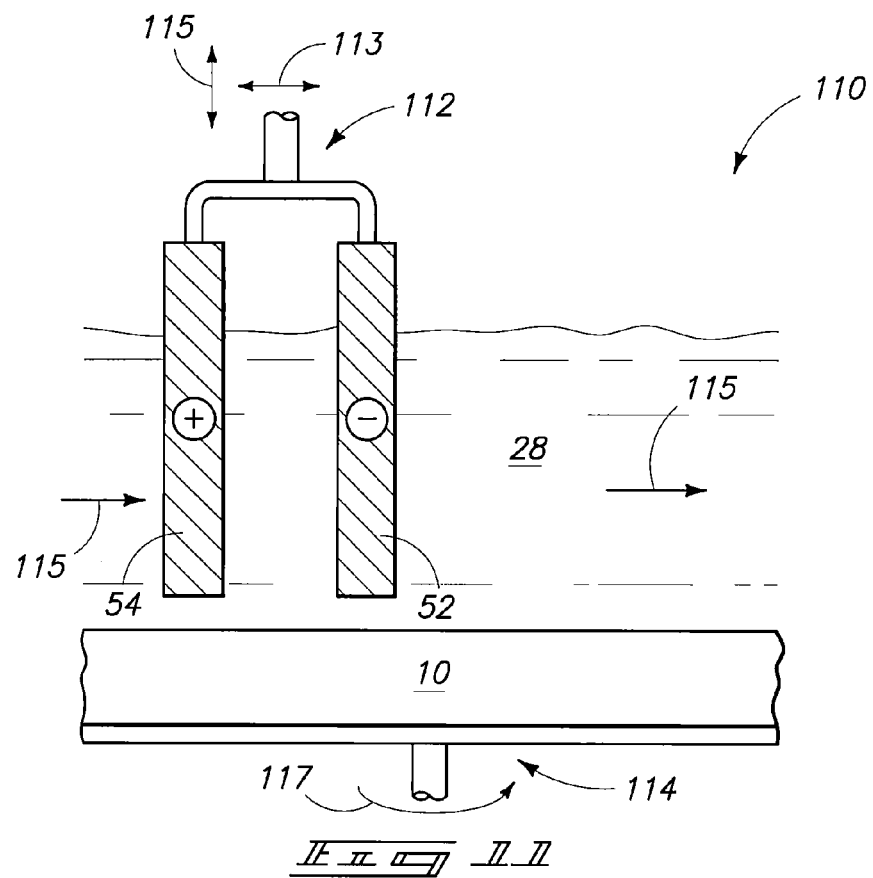
FIG. 11 is a diagrammatic, cross-sectional side view of a region of an apparatus being utilized to treat a semiconductor substrate with an electrical field and a flowing liquid to remove particles in accordance with another example embodiment.

FIG. 11 shows a system 110 configured for utilization of electroosmosis to assist in removal of particles. Similar numbering will be used to describe FIG. 11 as was utilized above in describing FIGS. 1-8, where appropriate.

System 110 includes a liquid 28 flowing across a semiconductor substrate 10. The flow of the liquid is diagrammatically illustrated with arrows 115.

System 110 includes electrodes 52 and 54 of the type described above with reference to FIGS. 7 and 8. However, unlike FIGS. 7 and 8, the electrodes of FIG. 11 are above substrate 10 rather than being on opposing lateral sides of substrate 10. Thus, an electric field generated between the electrodes 52 and 54 is across a portion of wafer 10 rather than across an entirety of wafer 10, which reduces the amount voltage needed to maintain a given field. The electrodes 52 and 54 may be connected to one another through a power source (not shown in FIG. 11) analogous to the power source 56 of FIGS. 7 and 8.

Electrodes 52 and 54 are connected to a support mechanism 112 which is configured to move the electrodes laterally (diagrammatically represented by arrow 113), and vertically (diagrammatically illustrated by arrow 115). Also, substrate 10 is supported by a mechanism 114 configured to rotate the substrate (diagrammatically represented by arrow 117). In operation, the substrate may be rotated by mechanism 114, and the electrodes may be moved by mechanism 112, so that the electrodes are passed over an entirety of an upper surface of the substrate. Thus, the entire upper surface may be exposed to electroosmosis created between electrodes 52 and 54 to assist in removal of particles from over the upper surface of substrate 10.

Figure 12:
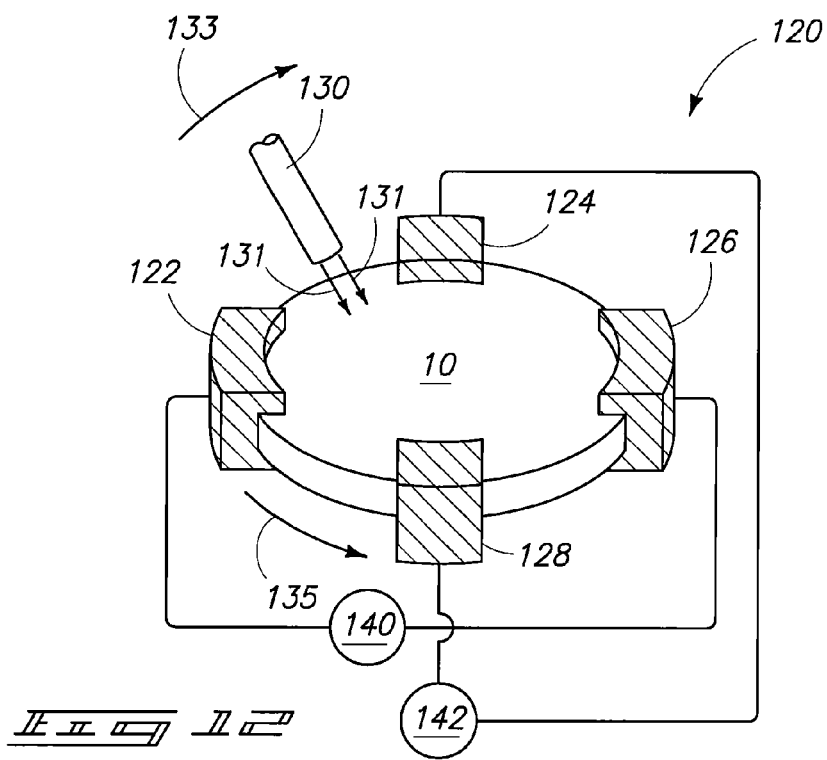
FIG. 12 is a diagrammatic, three-dimensional view of a region of an apparatus being utilized to treat a semiconductor substrate with an electrical field and a flowing liquid to remove particles in accordance with another example embodiment.

FIG. 12 shows another system (120) configured for utilization of electroosmosis to assist in removal of particles. Similar numbering will be used to describe FIG. 12 as was utilized above in describing FIGS. 1-8, where appropriate.

System 120 is a modified liquid-spray apparatus. A semiconductor substrate 10 is retained within a plurality of clamps 122, 124, 126 and 128; and a nozzle 130 is provided over the substrate and configured to spray liquid onto the substrate (the spray of the liquid is represented by arrows 131). The nozzle may be configured to be moved relative to the substrate (the movement of the nozzle is represented by arrow 133)

and/or the substrate may be configured to be moved relative to the nozzle (the movement of the substrate is represented by arrow 135).

The clamps 122, 124, 126 and 128 are arranged in sets of opposing pairs; with clamps 122 and 126 being in opposing relation to one another, and with clamps 124 and 128 being in opposing relation one another. Opposing clamps 122 and 126 are connected to a power source 140 which may be utilized to establish an electric field between claims 122 and 126; and similarly opposing clamps 124 and 128 are connected to a power source 142 which may be utilized to establish an electric field between claims 124 and 128. In some embodiments, the same power source may be utilized to establish an electric field between multiple opposing pairs of clamps, rather than using the multiple power source configuration shown in FIG. 12. Also, in some embodiments there may be only a single opposing pair of clamps that is utilized to generate an electric field, or there may be more than the shown two opposing pairs of clamps utilized to generate electric fields. The electric fields generated between different sets of opposing pairs of clamps may be formed simultaneously with one another, or sequentially relative to one another; and may utilize one or both of alternating current and direct current.

In operation, an electric field is generated across a substrate 10 utilizing one or more opposing pairs of clamps, and such field creates electroosmosis to assist in transporting particles from a surface of substrate 10 into the liquid projected across the surface with the spray nozzle 130.

FIG. 13 shows a system 150 that may be utilized for electrophoretically treating a batch of semiconductor substrates. The apparatus includes multiple electrodes 152, 154 and 156 coupled to a power source 158. Although three electrodes are shown, in other embodiments there may be other numbers of electrodes; and although only one power source is shown, in other embodiments there may be multiple power sources.

Semiconductor substrates 160 and 162 are retained between adjacent pairs of electrodes by support structures (not shown). In operation, liquid is flowed along primary surfaces of the substrates (the liquid flow is diagrammatically illustrated with arrows 155), and electric fields are formed between adjacent pairs of electrodes (the electric fields are represented by showing positive (+) and negative (−) charges on the electrodes). The semiconductor substrates and electrodes may be within a bath of liquid, analogous to the bath described with reference to FIG. 9, with the liquid flowing through the bath and across the surfaces of the substrates.

The system of FIG. 13 forms electric fields orthogonal to the primary surfaces of the semiconductor substrates, and thus is configured for utilizing electrophoresis to assist in transporting particles into the flowing liquid. The system may be modified to also provide electric fields parallel to the primary surfaces of the semiconductor substrates so that the system may also utilize electroosmosis to assist in transporting particles into the flowing liquid. FIG. 14 shows system 150 modified to comprise a pair of electrodes 164 and 166 along the opposing lateral surfaces of the semiconductor substrates 160 and 162 so that the system may utilize both electroosmosis and electrophoresis to assist in transporting particles into a flowing liquid (not shown in FIG. 14). The electrodes 164 and 166 are connected to one another through a power source 168, with such power source being suitable to create the electric field between the electrodes 164 and 166.

In some embodiments, the removal of particles may be enhanced by altering surface properties of the substrate, surface properties of particles, and/or properties of a rinsing solution (with the "rinsing solution" being the liquid flowed across a semiconductor substrate during particle removal).

One method of altering surface properties of the substrate and/or particles is to provide additives within the rinsing solution; with the additives being suitable to modify surfaces of at least some of particles and/or to modify surfaces of a semiconductor substrate. The additives may be provided to a concentration of from about 0.001 weight percent to about 1 weight percent. Example additives are surfactants. The surfactants may be any surfactants suitable to modify properties of particle surfaces and/or substrate surfaces, and may, for example, include anionic surfactants, nonionic surfactants, cationic surfactants, and ampholytic surfactants; including, but not limited to, surfactants available from Dow chemical as TRITON™, TERGITOL™, DOWFAX™ and ECOSURF™ materials.

Figure 15:
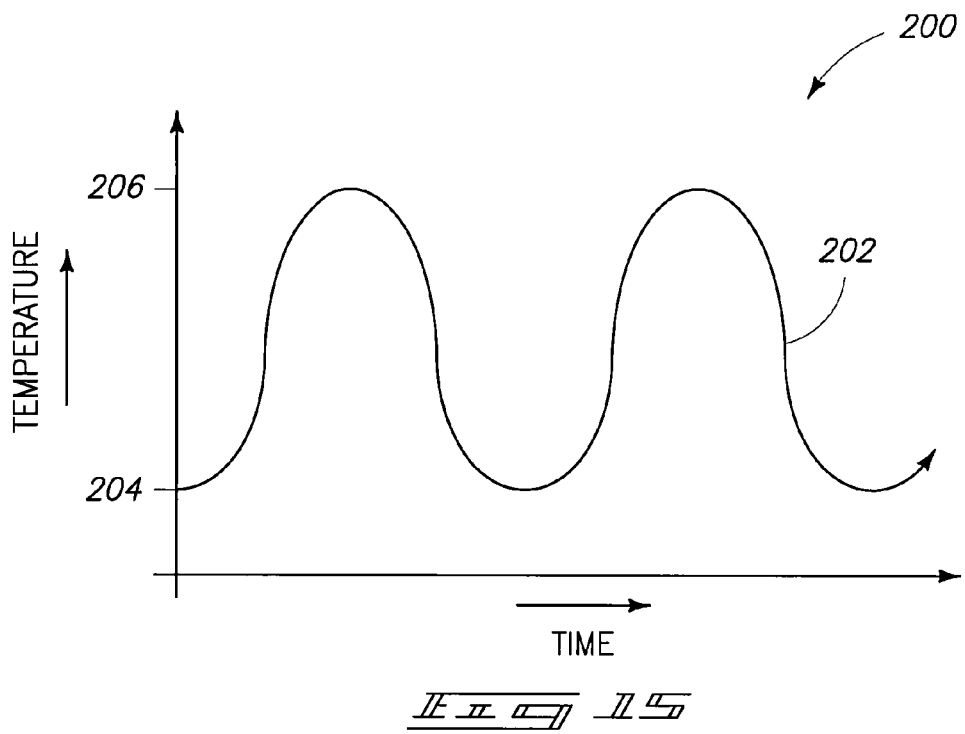
FIGS. 15-17 are graphical illustrations of dynamic changes in temperature, pH and ionic strength, relative to time, that may occur in some example embodiments.
Figure 16:
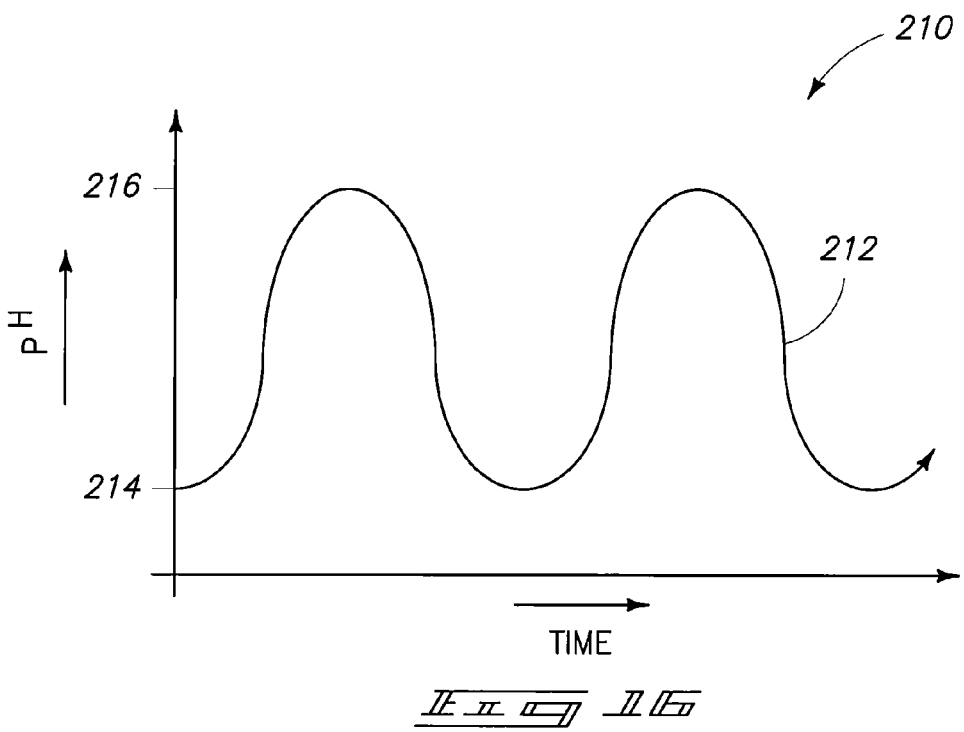
Figure 17:
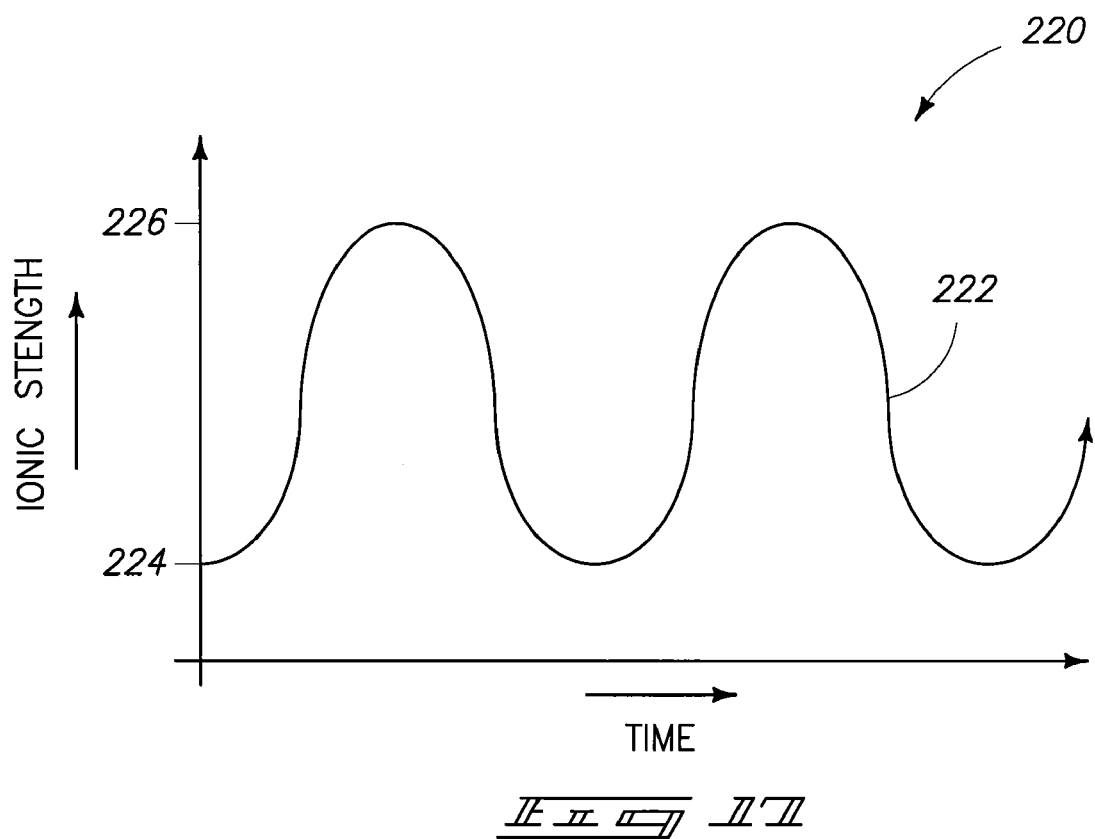

Methods of altering properties of the rinse solution may include modification of pH, ionic strength and/or temperature. Some embodiments include dynamically altering a rinse solution during utilization of the rinse solution. The dynamic alteration may comprise methods discussed in U.S. patent application Ser. No. 12/136,661; and may comprise alteration of any of numerous properties of the solution, including, for example, a temperature of the solution, a pH of the solution, and/or concentrations of one or more components of the solution. FIGS. 15-17 graphically illustrate dynamic alteration of temperature, pH, and ionic strength, respectively.

Referring to FIG. 15, a graph 200 comprises an x-axis corresponding to time, and a y-axis corresponding to temperature. A curve 202 shows the variation of the temperature of a rinse solution with time, and specifically shows that the temperature is continuously variable over a period of time. In other words, the temperature is non-static over the period time, as opposed to reaching a static equilibrium. The shown curve corresponds to a temperature gradient. The curve may be considered to comprise multiple iterations of a process in which the temperature goes between values 204 and 206.

The low temperature 204 and high temperature 206 may differ from one another by at least about 30° C., and in some embodiments may differ from one another by at least about 60° C. For instance, the low temperature 204 may correspond to about room temperature (23° C.), and the high temperature 206 may correspond to about 90° C.

The time for each iteration from a low temperature to a high temperature, and back, may be any suitable duration; and may be, for example, at least a few seconds in embodiments in which the low temperature and high temperature differ from one another by at least about 30° C.

The curve 202 is shown to be continuously variable during the entire duration illustrated in graph 200. The fluctuation of the temperature between the low and high temperatures may be referred to as temperature sweeping. At some point the temperature sweeping may be ceased, and the substrate exposed to a static, equilibrium, temperature. Such may be accomplished by flowing a static temperature rinse solution across the substrate.

The temperature sweeping may provide benefits during the rinsing of a substrate and utilization of electrokinetic forces. For instance, the temperature sweeping may enhance kinetics of reactions in some embodiments, and may inhibit kinetics of reactions in other embodiments. As another example, the magnitude of electrostatic interaction between particles and an electric field may be influenced by temperature in some embodiments, and in such embodiments the temperature sweeping may enhance rocking of particles when the particles are exposed to an electric field.

Referring to FIG. 16, a graph 210 comprises an x-axis corresponding to time, and a y-axis corresponding to pH. A curve 212 shows the variation of the pH of a rinse solution with time, and specifically shows that the pH is continuously variable over a period of time. In other words, the pH is non-static over the period of time, as opposed to reaching a static equilibrium. The shown curve corresponds to a pH gradient. The example curve may be considered to comprise multiple iterations of a process in which the pH goes between values 214 and 216.

The low pH 214 and high pH of 216 may differ from one another by five or more pH units, and in some embodiments may differ from one another by eight or more pH units. For instance, the low pH 214 may correspond to 2 (or another suitable acidic pH), and the high pH 216 may correspond to 10 (or another suitable basic pH).

The time for each iteration from a low pH to a high pH, and back, may be any suitable duration; and may be, for example, at least a few seconds.

The curve 212 is shown to be continuously variable during the entire duration illustrated in graph 210. The fluctuation of the pH between the low and high pH's may be referred to as pH sweeping.

The pH sweeping may provide benefits during the rinsing of a substrate and utilization of electrokinetic forces. For instance, the pH sweeping may alter surface charges of the particles to enhance electrostatic coupling between an electric field and the particles, and thereby enhance removal of the particles. As another example, the pH sweeping may alter the surface charges of both the substrate and the particles to create electrostatic repulsion between the particles and the substrate.

Referring to FIG. 17, a graph 220 comprises an x-axis corresponding to time, and a y-axis corresponding to ionic strength. A curve 222 shows the variation of the ionic strength within a rinse solution with time, and specifically shows that the ionic strength is continuously variable over a period of time. In other words, the ionic strength is non-static over the period time, as opposed to reaching a static equilibrium.

The shown curve corresponds to a concentration gradient. The curve may be considered to comprise multiple iterations of a process in which the ionic strength fluctuates between values 224 and 226.

The low concentration 224 and high concentration 226 may differ from one another by several fold, and in some embodiments may differ from one another by one or more orders of magnitude.

The time for each iteration from a low ionic strength to a high ionic strength, and back, may be any suitable duration; and may be, for example, at least three seconds.

The curve 222 is shown to be continuously variable during the entire duration illustrated in graph 220. The fluctuation of the ionic strength between the low and high ionic strengths may be ceased at some point, and the substrate exposed to a static, equilibrium, ionic strength.

The alteration of ionic strength may provide benefits during the rinsing of a substrate and utilization of electrokinetic forces. For instance, the alteration of ionic strength may alter the zeta potential of the particles to thereby enhance electrostatic coupling of the particles with an electric field.

FIG. 18 shows interaction forces as a function of particle size for silicon oxide particles on a silicon oxide surface, and specifically indicates that Van der Waals adhesion forces are orders of magnitude larger than the hydrodynamic force for typical flows that can be directed onto the center of a particle. For at least this reason, alternate removal forces, such as those discussed herein are advantageous to dislodge nanoparticles from surfaces. In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim,

1. A method of removing particles from over a surface of a semiconductor substrate, comprising:
   providing a pair of electrodes which are spaced apart from one another along the surface of the substrate and which are configured to form an electric field parallel to the surface of the substrate while the substrate is supported on a mechanism configured to rotate the substrate;
   flowing a liquid across the surface and the particles; and
   while the liquid is flowing, utilizing the electric field parallel to the substrate surface to induce movement of the particles relative to the surface through electroosmosis, and to thereby enhance transport of the particles from the surface and into the liquid, and wherein during utilization of the electric field to induce movement of the particles, both electrodes of said pair are entirely above said substrate surface and joined together by a mechanism that moves the electrodes laterally across the substrate surface.

2. The method of claim 1 wherein the liquid comprises additives suitable to modify surfaces of at least some of the particles, the additives being present within the liquid to a concentration of from about 0.001 weight percent to about 1 weight percent.

3. The method of claim 2 wherein the additives include surfactants.

4. The method of claim 2 wherein the additives include ions.

5. The method of claim 1 wherein electrophoresis is utilized in addition to the electroosmosis.

6. The method of claim 5 further comprising dynamically altering a temperature of the liquid across a range of at least about 30° C. during the utilization of the electrophoresis.

7. The method of claim 5 further comprising dynamically altering a pH of the liquid across a range of at least about 5 pH units during the utilization of the electrophoresis.

8. The method of claim 1 further comprising dynamically altering a temperature of the liquid across a range of at least about 30° C. during the utilization of the electroosmosis.

9. The method of claim 1 further comprising dynamically altering a pH of the liquid across a range of at least about 5 pH units during the utilization of the electroosmosis.

10. The method of claim 5 wherein the electroosmosis and electrophoresis are utilized simultaneously.

11. The method of claim 1 wherein the electric field is formed between the electrodes utilizing alternating current.

12. The method of claim 1 wherein the electric field is formed between the electrodes utilizing direct current.

* * * * *